(12) United States Patent
Shih et al.

(10) Patent No.: US 9,748,134 B2
(45) Date of Patent: *Aug. 29, 2017

(54) METHOD OF MAKING INTERCONNECT STRUCTURE

(71) Applicant: Taiwan Semiconductor Manufacturing Company, Ltd., Hsin-Chu (TW)

(72) Inventors: Po-Cheng Shih, Hsinchu (TW); Yu-Yun Peng, Hsinchu (TW); Chia Cheng Chou, Keelung (TW); Joung-Wei Liou, Zhudong Town (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/018,661

(22) Filed: Feb. 8, 2016

(65) Prior Publication Data

US 2016/0155663 A1 Jun. 2, 2016

Related U.S. Application Data

(60) Continuation of application No. 14/494,211, filed on Sep. 23, 2014, now Pat. No. 9,257,331, which is a
(Continued)

(51) Int. Cl.
*H01L 21/4763* (2006.01)
*H01L 21/768* (2006.01)
(Continued)

(52) U.S. Cl.
CPC .... *H01L 21/76832* (2013.01); *H01L 21/0214* (2013.01); *H01L 21/02164* (2013.01);
(Continued)

(58) Field of Classification Search
CPC ......... H01L 21/76832; H01L 21/76802; H01L 21/76835; H01L 21/02164; H01L 21/0214;
(Continued)

(56) References Cited

U.S. PATENT DOCUMENTS 6,072,227 A    6/2000  Yau et al.
6,323,511 B1 * 11/2001 Marsh ..................... C23C 16/18
                                                        257/295
(Continued)

OTHER PUBLICATIONS

Office Action dated Aug. 26, 2013 with English Translation from corresponding application No. 102012109338.5 (German).

*Primary Examiner* — Luan C Thai
(74) *Attorney, Agent, or Firm* — Haynes and Boone, LLP

(57) ABSTRACT

A method of making a semiconductor device including forming a first adhesion layer over a substrate. The method further includes forming a second adhesion layer over the first adhesion layer, where the second adhesion layer is formed using an inert gas with a first flow rate under a first RF power. Additionally, the method includes forming a low-k dielectric layer over the second adhesion layer, where the low-k dielectric layer is formed using the inert gas with a second flow rate under a second RF power under at least one of the following two conditions: 1) the second flow rate is different from the first flow rate; or 2) the second RF power is different from the first RF power. Furthermore, the method includes forming an opening in the dielectric layer, the second adhesion layer, and the first adhesion layer. Additionally, the method includes forming a conductor in the opening.

20 Claims, 7 Drawing Sheets

Related U.S. Application Data division of application No. 13/460,279, filed on Apr. 30, 2012, now Pat. No. 8,853,831.

(60) Provisional application No. 61/617,530, filed on Mar. 29, 2012.

(51) Int. Cl.
 *H01L 23/532* (2006.01)
 *H01L 21/02* (2006.01)

(52) U.S. Cl.
 CPC .. *H01L 21/02167* (2013.01); *H01L 21/76801* (2013.01); *H01L 21/76802* (2013.01); *H01L 21/76807* (2013.01); *H01L 21/76835* (2013.01); *H01L 21/76846* (2013.01); *H01L 21/76871* (2013.01); *H01L 21/76877* (2013.01); *H01L 21/76879* (2013.01); *H01L 23/5329* (2013.01); *H01L 23/53295* (2013.01); *H01L 21/02304* (2013.01); *H01L 23/53238* (2013.01); *H01L 2924/0002* (2013.01)

(58) Field of Classification Search
 CPC ......... H01L 21/02167; H01L 21/76871; H01L 21/76877
 USPC ........................................................ 438/637
 See application file for complete search history.

(56) References Cited

U.S. PATENT DOCUMENTS

| | | | |
|---|---|---|---|
| 6,340,435 B1 * | 1/2002 | Bjorkman | ............. C23C 16/401 216/13 |
| 6,762,127 B2 | 7/2004 | Boiteux et al. | |
| 7,030,041 B2 | 4/2006 | Li et al. | |
| 7,351,656 B2 | 4/2008 | Sakata et al. | |
| 7,465,676 B2 * | 12/2008 | Tsai | ................... H01L 21/76832 257/760 |
| 2004/0175932 A1 | 9/2004 | Kim et al. | |
| 2009/0224374 A1 | 9/2009 | Bhatia et al. | |
| 2011/0012238 A1 | 1/2011 | Cohen et al. | |
| 2011/0204492 A1 | 8/2011 | Xie et al. | |

* cited by examiner

US 9,748,134 B2

METHOD OF MAKING INTERCONNECT STRUCTURE

PRIORITY CLAIM

The present application is a continuation of U.S. application Ser. No. 14/494,211, filed Sep. 23, 2014, issuing on Feb. 9, 2016 as U.S. Pat. No. 9,257,331, which is a divisional of U.S. application Ser. No. 13/460,279, filed Apr. 30, 2012 and issuing as U.S. Pat. No. 8,853,831, which claims priority of U.S. Provisional Application No. 61/617,530, filed Mar. 29, 2012, each of which are incorporated herein by reference in their entireties.

TECHNICAL FIELD

The present disclosure relates to semiconductor devices and particularly to methods of making interconnect structure.

BACKGROUND

Semiconductor devices are used in a variety of electronic applications, such as personal computers, cell phones, digital cameras, and other electronic equipment. As technology has progressed, the demand for smaller semiconductor devices with improved performance has increased. As feature densities in the semiconductor devices increase, the widths of the conductive lines, and the spacing between the conductive lines of back-end of line (BEOL) interconnect structures in the semiconductor devices also need to be scaled down.

Several approaches have been implemented in order to meet these demands. As the widths of the conductive lines reduce, the spacing between two successive layers with conductive lines also reduces. The reduced spacing may therefore increase resistance-capacitance (RC) time delay. To reduce the RC time delay, low dielectric constant (low-k) materials are being used as insulating materials, and copper is replacing aluminum for interconnect structures. Advantages of using copper for semiconductor device interconnects include abilities to operate faster and manufacture thinner conductive lines because copper has lower resistivity and increased electromigration resistance compared to aluminum. Combining copper interconnects with low-k dielectric materials increases interconnect speed by reducing the RC time delay, for example.

Copper interconnects are often formed using damascene processes rather than by direct etching. Damascene processes are typically either single or dual damascene, which include forming openings by patterning and etching intermetal dielectric (IMD) layers and filling the openings with copper. However, there are some challenges in the copper damascene structure, such as adhesion issues between the low-k dielectric material and the underlying layer. The adhesion issues may cause film cracking and/or peeling and, therefore, result in device package qualification failure.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
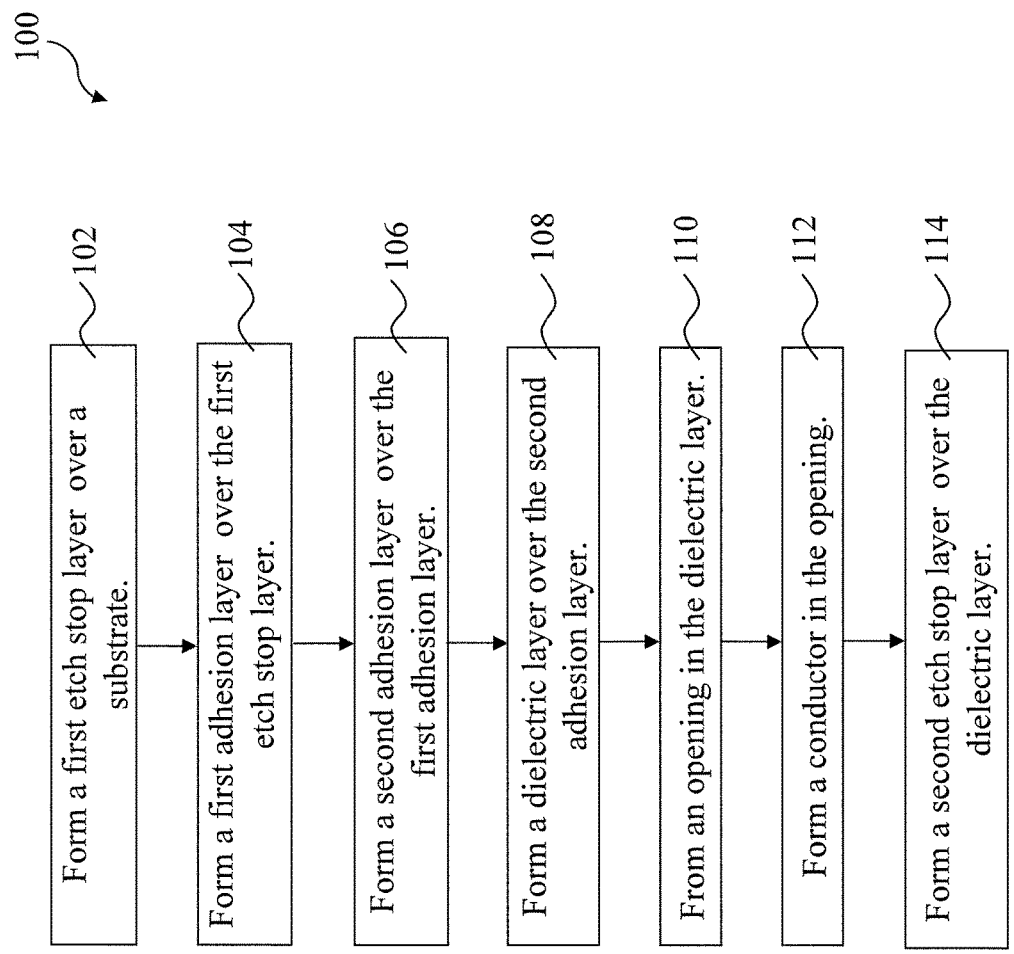
FIG. 1 is a flow chart of a method for fabricating an integrated circuit device according to an embodiment of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1 and 2-7, a method 100 and a semiconductor device 200 are collectively described below. The semiconductor device 200 illustrates an integrated circuit, or portion thereof, that can comprise memory cells and/or logic circuits. The semiconductor device 200 can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors, other suitable components, and/or combinations thereof. It is understood that additional steps can be performed before, during, and/or after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

Figure 2:
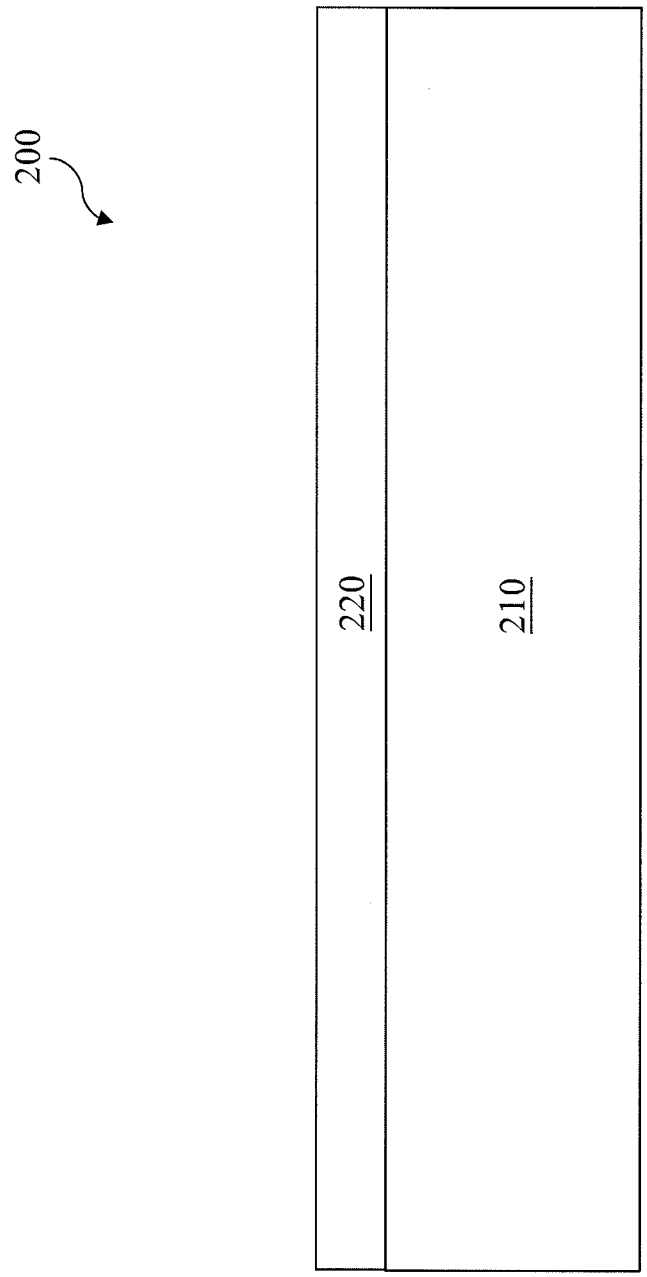
FIGS. 2-7 are cross-sectional views of an integrated circuit device during various fabrication stages according to the method of FIG. 1 according to an embodiment of the present disclosure.

Referring to FIGS. 1 and 2, the method 100 begins at step 102, wherein a first etch stop layer (ESL) 220 is formed over a substrate 210. In the present embodiment, the substrate 210 is a semiconductor substrate comprising silicon. In some alternative embodiments, the substrate 210 comprises an elementary semiconductor including silicon and/or germanium in crystal; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some embodiments, the semiconductor substrate may include a doped epitaxial layer. In other embodiments, the silicon substrate may include a multilayer compound semiconductor structure.

The substrate 210 may include various doped regions depending on design requirements (e.g., p-type wells or n-type wells). The doped regions may be doped with p-type dopants, such as boron or $BF_2$; n-type dopants, such as phosphorus or arsenic; or a combination thereof. The doped regions may be formed directly in the substrate 210, in a P-well structure, in an N-well structure, in a dual-well structure, or using a raised structure. The semiconductor device 200 may include a P-channel Field Effect Transistor (PFET) device and/or an N-channel Field Effect Transistor (NFET) device. Thus, the substrate 210 may include various doped regions configured for the PFET device and/or the NFET device.

The first etch stop layer 220 for controlling the end point during subsequent etching processes is deposited on the above-described substrate 210. In some embodiments, the first etch stop layer 220 comprises a material including C, Si, N, or H. In some embodiments, the first etch stop layer 220 is formed of silicon oxide, silicon nitride, silicon carbide, silicon oxynitride, or combinations thereof. In some embodiments, the first etch stop layer 220 has a thickness of about 10 angstroms to about 1000 angstroms. In some embodiments, the first etch stop layer 220 is formed through any of a variety of deposition techniques, including, low-pressure chemical vapor deposition (LPCVD), atmospheric-pressure chemical vapor deposition (APCVD), plasma-enhanced chemical vapor deposition (PECVD), physical vapor deposition (PVD), sputtering, and future-developed deposition procedures. In some alternative embodiments, the first etch stop layer 220 is formed by a thermal process. In some embodiments, the first etch stop layer 220 having a thickness ranges from about 100 Angstroms to about 300 Angstroms.

Figure 3:
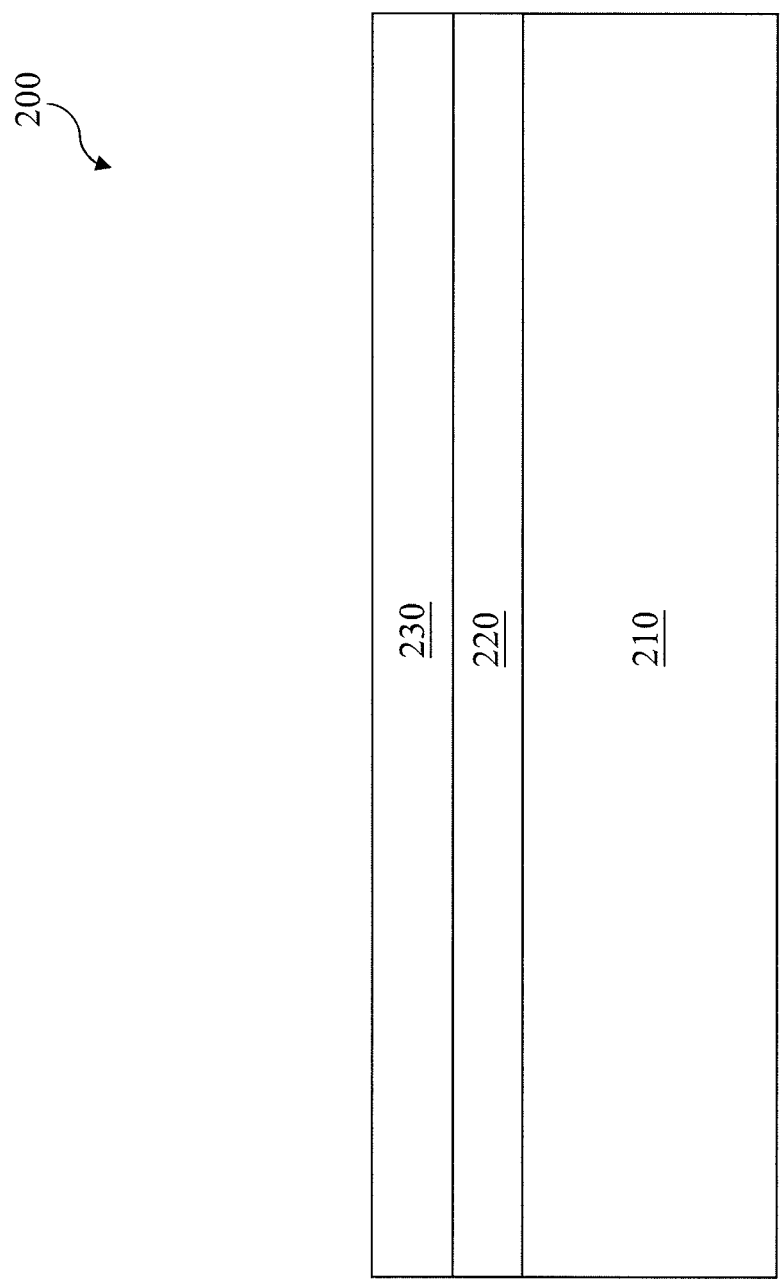

Referring to FIGS. 1 and 3, the method 100 continues with step 104 in which a first adhesion layer 230 is formed over the first etch stop layer 220. In some embodiments, the first adhesion layer 230 includes SiOx-containing material, SiCN-containing material, SiON-containing material, or combinations thereof. In some embodiments, the first adhesion layer 230 is formed using LPCVD process, APCVD process, PECVD process, PVD process, sputtering, or future-developed deposition procedures. In some alternative embodiments, the first adhesion layer 230 is formed using a thermal process. In the present embodiment, the first adhesion layer 230 is tetraethoxysilane (TEOS). In some embodiments, the first adhesion layer 230 having a thickness ranges from about 100 Angstroms to about 400 Angstroms.

Figure 4:
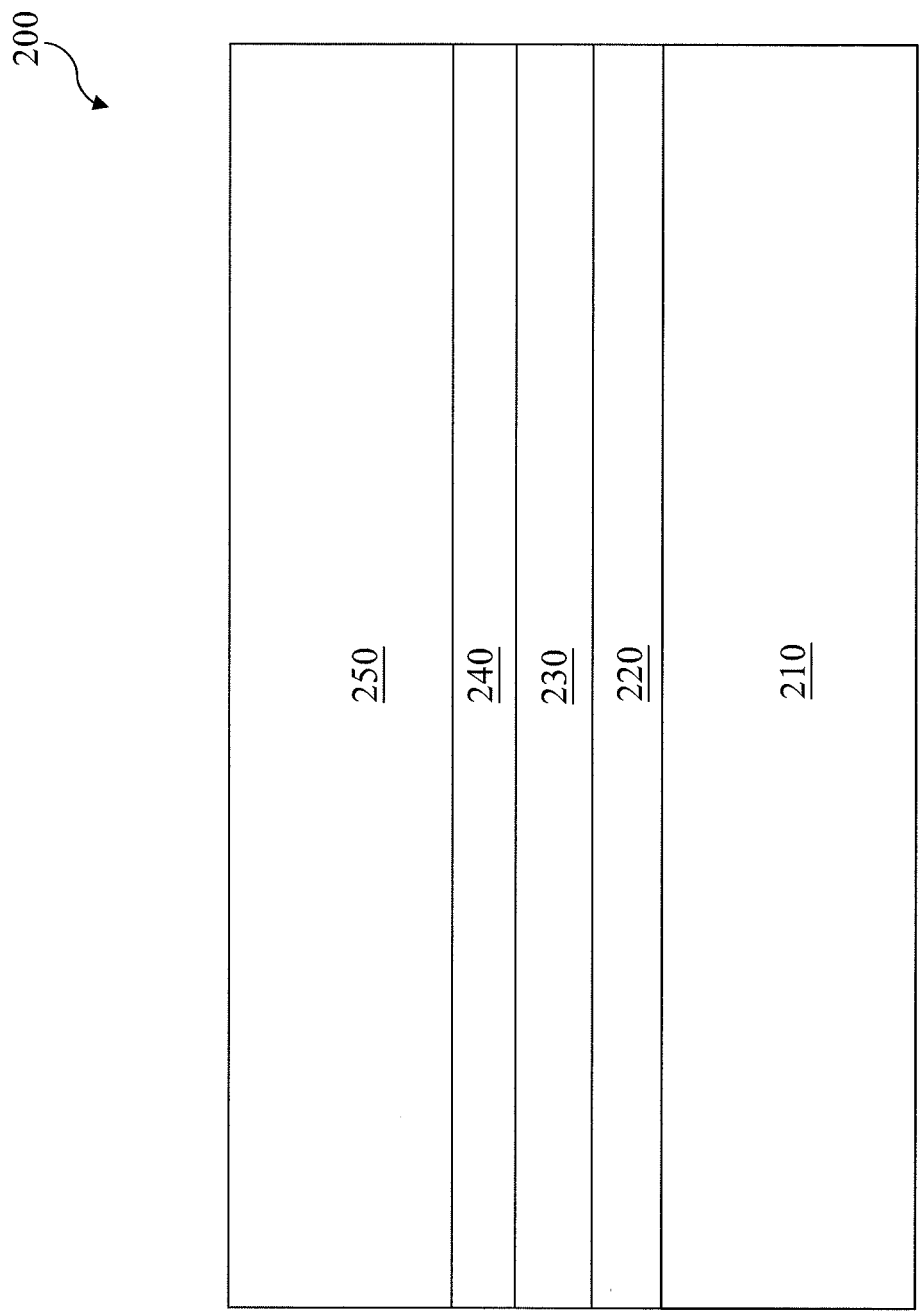

Referring to FIGS. 1 and 4, the method 100 continues with step 106 in which a second adhesion layer 240 is formed over the first adhesion layer 230. In some embodiments, the second adhesion layer 240 is formed using LPCVD process, APCVD process, PECVD process, PVD process, sputtering, or future-developed deposition procedures. In some alternative embodiments, the second adhesion layer 240 is formed using a thermal process. In some embodiments, the second adhesion layer 240 comprises a material including Si, C, O, or H. In some embodiments, the second adhesion layer 240 is a C-containing layer with a carbon content (C content) ratio in the base composition being greater than 13 at % (atomic percent). In some alternative embodiments, the second adhesion layer 240 is a C-containing layer with C content ratio in the base composition ranging from about 15 at % to about 30 at %. In some embodiments, the second adhesion layer 240 having a thickness ranges from about 5 Angstroms to about 300 Angstroms.

Still referring to FIGS. 1 and 4, the method 100 continues with step 108 in which a dielectric layer 250 is formed over the second adhesion layer 240. The dielectric layer 250 may be a single layer or a multi-layered structure. In some embodiments, the dielectric layer 250 is formed using CVD process, such as PECVD process, LPCVD process, or ALD process. In some embodiments, the dielectric layer 250 comprises a material including Si, C, O, or H. In some embodiments, the dielectric layer 250 comprises elements same as to the second adhesion layer 240 but with a C content ratio less than the C content ratio of the second adhesion layer 240. In some embodiments, the dielectric layer 250 is a C-containing layer with a C content ratio less than 13 at %. In some alternative embodiments, the dielectric layer 250 is a C-containing layer with a C content ratio ranging from about 10 at % and to 13 at %. In some embodiments, the dielectric layer 250 having a thickness ranges from about 300 Angstroms to about 2500 Angstroms.

In some embodiments, the second adhesion layer 240 and the dielectric layer 250 are continuously formed by PECVD. In some embodiments, the second adhesion layer 240 and the dielectric layer 250 use at least one precursor, such as tetramethylcyclotetrasiloxane (TMCTS), octamethylcyclotetrasiloxane (OMCTS), diethoxymethylsilane (DEMS), diethoxyldimethylsilane (DEDMS) and other related cyclic and non-cyclic silanes and siloxanes. In some embodiments, the precursor may be used in conjunction with an inert gas such as He or Ar and/or a reactant gas such as $H_2O$, $O_2$, and/or $CO_2$. In some embodiments, the second adhesion layer 240 and the dielectric layer 250 are continuously formed by PECVD with the same precursor and inert gas. In some embodiments, the second adhesion layer 240 and the dielectric layer 250 are continuously formed by PECVD with the same precursor and inert gas, but with different flow rates of the inert gas and/or different RF powers. In some embodiments, a flow rate of the inert gas for forming the second adhesion layer 240 is greater than a flow rate of the inert gas for forming the dielectric layer 250. In some alternative embodiments, the second adhesion layer 240 is formed using a RF power greater than a RF power for forming the dielectric layer 250. In at least one embodiment, a flow rate of an inert gas for forming the second adhesion layer 240 is greater than a flow rate of the inert gas for forming the dielectric layer 250 and a RF power for forming the second adhesion layer 240 is greater than a RF power for forming the dielectric layer 250.

In some embodiments, the dielectric layer 250 is a low dielectric constant (low-k) layer having a dielectric constant of less than 3.0 and functions as an inter-metal dielectric (IMD) layer. In some embodiments, the dielectric layer 250 is a low-k layer having a dielectric constant ranging from about 2.5 to about 2.8. A wide variety of low-k materials may be employed in accordance with embodiments, for example, spin-on inorganic dielectrics, spin-on organic dielectrics, porous dielectric materials, organic polymer, organic silica glass, SiOF series material (FSG), hydrogen silsesquioxane (HSQ) series material, methyl silsesquioxane (MSQ) series material, or porous organic series material.

In some embodiments, the second adhesion layer 240 has a dielectric constant substantially the same as the dielectric constant of the dielectric layer 250. In some alternative embodiments, the second adhesion layer 240 has a dielectric constant slightly greater than the dielectric constant of the dielectric layer 250, e.g., the different of dielectric constants is less than 2%. In some embodiments, the second adhesion layer 240 functions as an adhesion promotion layer to improve adhesion between the dielectric layer 250 and the first adhesion layer 230. Measured adhesion values that can be obtained by using the second adhesion layer 240 are about 14 J/m$^2$ or greater. The measured adhesion values are higher than those in which no further adhesion layer is present between the dielectric layer 250 and the first adhesion layer 230 for about 7% or greater.

Figure 5:
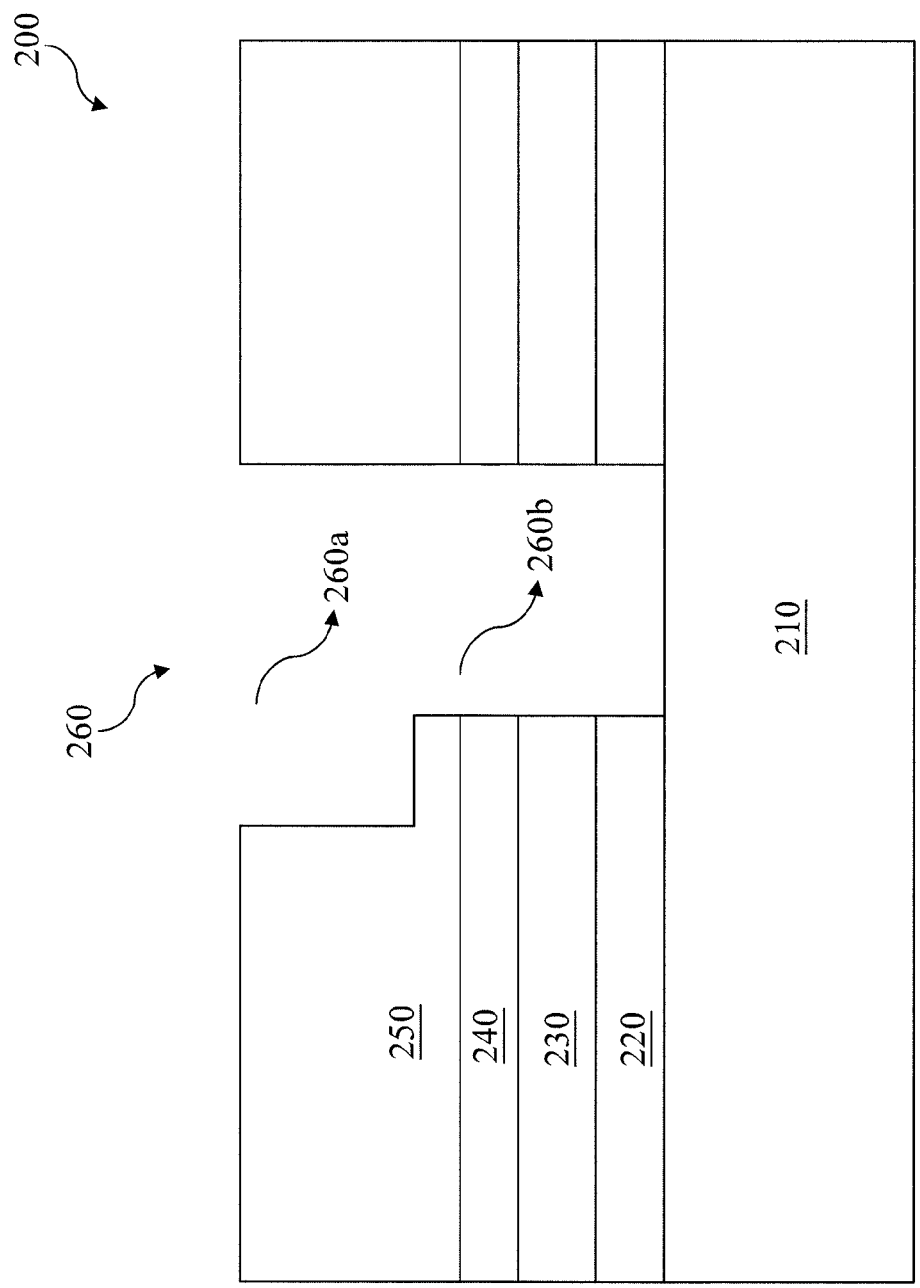

Referring to FIGS. 1 and 5, the method 100 continues with step 110 in which an opening 260 is formed in the dielectric layer 250. In some embodiments, the opening 260 is formed through the dielectric layer 250, the second adhesion layer 240, the first adhesion layer 230, and the first etch stop layer 220. In some embodiments, the opening 260 is a dual damascene opening including an upper trench section 260a and a lower via-hole section 260b to define a contact region. Although the embodiments illustrate dual damascene opening in the dielectric layer 250, the method disclosed in the present application is applicable for an embodiment having single damascene openings in the IMD layer. In dual damascene techniques including a "via-first" patterning method or a "trench-first" patterning method, the upper trench section 260a and the lower via-hole section 260b may be formed using a typical lithographic with masking technologies and anisotropic etch operation (e.g. plasma etching or reactive ion etching). A bottom etch stop layer, a middle etch stop layer, a polish stop layer, or an anti-reflective coating (ARC) layer may be optionally deposited on or intermediately in the dielectric layer 250, providing a clear indicator of when to end a particular etching process.

Figure 6:
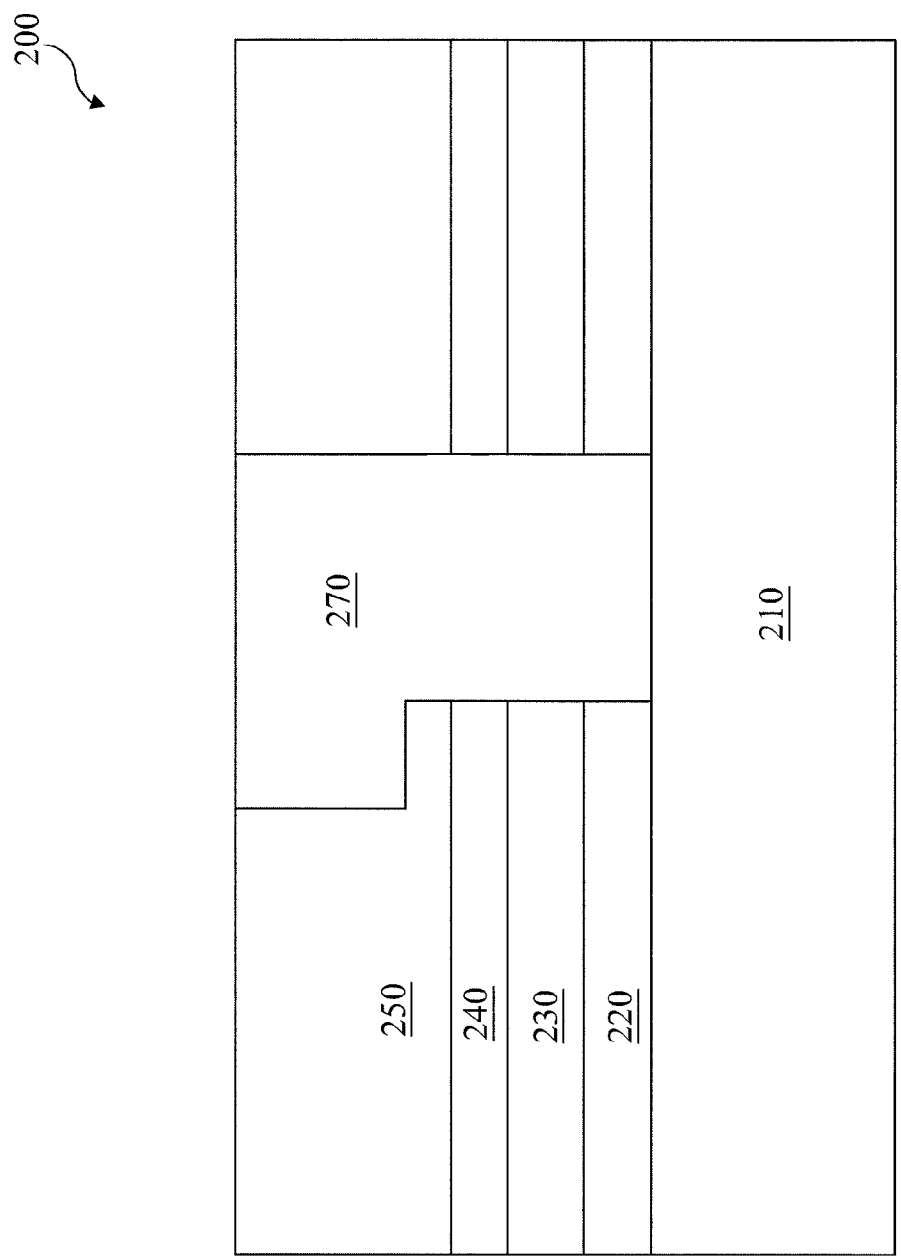

Referring to FIGS. 1 and 6, the method 100 continues with step 112 in which a conductor 270 is formed in the opening 260. In some embodiments, the conductor 270 is formed by a deposition process, e.g., electro-chemical plating (ECP). In some embodiments, the conductor 270 contains at least one main metal element, e.g., copper (Cu). In some alternative embodiments, the conductor 270 further contains an additive metal element different from the main metal element, such as aluminum.

Still referring to FIG. 6, a barrier layer (not shown) may be deposited to line the sidewalls the openings 260 before forming the conductor 270. In some embodiment, the barrier layer includes Ti, TiN, Ta, TaN, other proper material, or combinations thereof. A conductive seed layer (not shown) may be further formed over the barrier layer before forming the conductor 270. In at least one embodiment, the conductive seed layer is a metal alloy layer containing at least a main metal element, e.g., copper (Cu). In at least one embodiment, the conductive seed layer is formed by using PVD, CVD, PECVD, LPCVD, or other well-known deposition techniques. A chemical mechanical polishing (CMP) process may be performed after the formation of the conductor 270 to remove the excess portions of the conductor 270 over the dielectric layer 250, thus exposing the top surface of the dielectric layer 250 and achieving a planarized surface.

Figure 7:
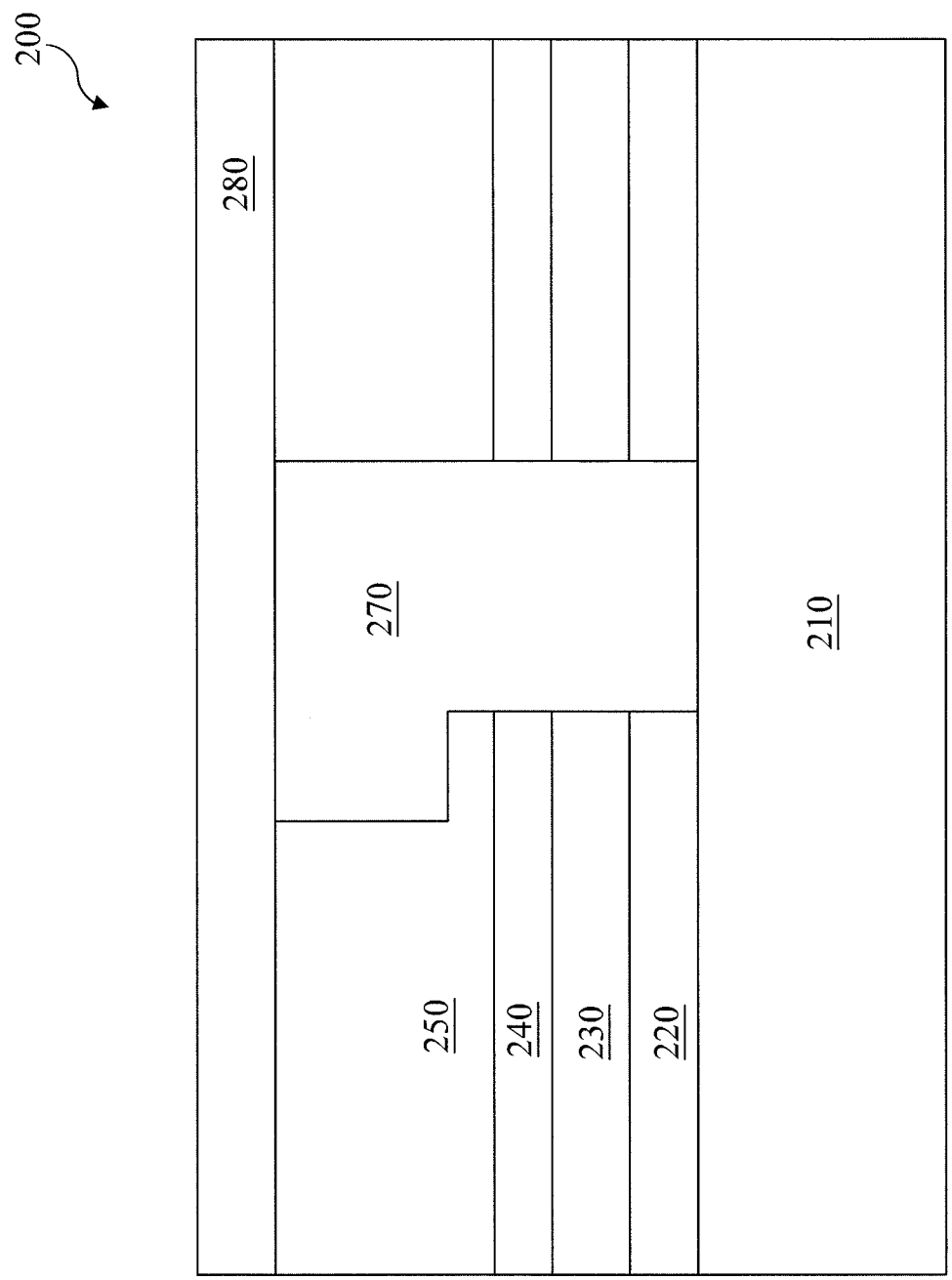

Referring to FIGS. 1 and 7, the method 100 continues with step 114 in which a second etch stop layer 280 is formed on the above-described planarized surface. The second etch stop layer 280 may control the end point during subsequent etching processes. The second etch stop layer 280 may be formed of silicon oxide, silicon nitride, silicon carbide, silicon oxynitride, or combinations thereof, with a thickness of about 10 angstroms to about 1000 angstroms, which may be formed through any of a variety of deposition techniques, including, LPCVD, APCVD, PECVD, PVD, sputtering, and future-developed deposition procedures.

In summary, the disclosed methods and integrated circuit devices result in improved device performance, including but not limited to, improved adhesion between the IMD layer and the underlying layer, and thus the peeling issue can be suppressed. Further, it can improve package capabilities by preventing from peeling during packaging process.

In at least one embodiment, a method of making a semiconductor device including forming a first adhesion layer over a substrate. The method further includes forming a second adhesion layer over the first adhesion layer, where the second adhesion layer is formed using an inert gas with a first flow rate under a first RF power. Additionally, the method includes forming a low-k dielectric layer over the second adhesion layer, where the low-k dielectric layer is formed using the inert gas with a second flow rate under a second RF power under at least one of the following two conditions: 1) the second flow rate is different from the first flow rate; or 2) the second RF power is different from the first RF power. Furthermore, the method includes forming an opening in the dielectric layer, the second adhesion layer, and the first adhesion layer. Additionally, the method includes forming a conductor in the opening.

In another embodiment, a method of making a semiconductor device includes forming an adhesion layer over a substrate, the adhesion layer having a first carbon content ratio. The method further includes forming a dielectric layer over and in contact with the adhesion layer, the dielectric layer having a second carbon content ratio, where the first carbon content ratio is greater than the second carbon content ratio. Additionally, the method includes forming a conductor in the dielectric layer.

A method of making a semiconductor device includes forming a first adhesion layer over a substrate. Furthermore, the method includes forming a second adhesion layer over the first adhesion layer, wherein the second adhesion layer comprises C, Si, or O. Additionally, the method includes forming a low-k dielectric layer over and in contact with the second adhesion layer, where the low-k dielectric layer comprises C, Si, or O, where an atomic percent of C in the low-k dielectric later is less than an atomic percent of C in the second adhesion layer. The method further includes forming a conductor in the low-k dielectric layer.

Although the embodiments have been described, it is not intended to limit the invention to the precise embodiments disclosed herein. Those skilled in this technology can still make various alterations and modifications without departing from the scope and spirit of this invention. Therefore, the scope of the present invention shall be defined and protected by the following claims and their equivalents.

What is claimed is:

1. A method of making a semiconductor device, the method comprising:
  forming an adhesion layer over a semiconductor substrate, the adhesion layer including tetraethoexysilane (TEOS);
  forming a first layer including carbon over the adhesion layer, wherein the first layer is formed using an inert gas with a first flow rate under a first RF power;
  forming a second layer over the first layer, wherein the second layer includes a low-k dielectric material formed using the inert gas with a second flow rate under a second RF power under at least one of the following two conditions:
  1) the second flow rate is different from the first flow rate; or 2) the second RF power is different from the first RF power;
forming an opening in the adhesion layer, the first layer and the second layer; and
depositing a conductor in the opening.

2. The method of claim 1, wherein the second flow rate is greater than the first flow rate.

3. The method of claim 1, wherein the second RF power is greater than the first RF power.

4. The method of claim 1, wherein the depositing the conductor includes:
depositing a barrier layer;
depositing a seed layer on the barrier layer in the opening; and
plating a conductive material on the seed layer.

5. The method of claim 1, wherein the forming the first layer and the forming the second layer are continuously formed by a plasma enhanced chemical vapor deposition (PECVD) process.

6. The method of claim 1, wherein the forming the first layer and the forming the second layer each use a precursor, the precursor selected from the group consisting of tetramethylcyclotetrasiloxane (TMCTS), octamethylcyclotetrasiloxane (OMCTS), diethoxymethylsilane (DEMS), diethoxyldimethylsilane (DEDMS), silane, and siloxane.

7. The method of claim 1, wherein the inert gas is one of He and Ar.

8. The method of claim 1, wherein the first layer has a carbon content ratio greater than 13 atomic percent (at %).

9. The method of claim 1, further comprising:
planarizing the conductor; and
forming an etch stop layer over the planarized conductor and the second layer.

10. A method of making a semiconductor device, the method comprising:
forming an adhesion layer over a substrate, the adhesion layer including tetraethoexysilane (TEOS);
using a continuous deposition process including forming a first layer over the adhesion layer, the first layer having a first carbon content ratio and forming a high-k dielectric layer over and in contact with the first layer, the high-k dielectric layer having a second carbon content ratio, wherein the first carbon content ratio is greater than the second carbon content ratio;
forming an opening through the adhesion layer, the first layer, and the high-k dielectric layer; and
forming a conductor in the opening.

11. The method of claim 10, wherein the forming the first layer includes forming the first layer having the first carbon content ratio to a first thickness and forming the high-k dielectric layer includes forming the high-k dielectric layer having the second carbon content ratio to a second thickness, the second thickness being greater than the first thickness.

12. The method of claim 10, wherein the continuous deposition process forms the first layer and the high-k dielectric layer using a same precursor and a same inert gas.

13. The method of claim 12, wherein the same precursor is one of tetramethylcyclotetrasiloxane (TMCTS), octamethylcyclotetrasiloxane (OMCTS), diethoxymethylsilane (DEMS), and diethoxyldimethylsilane (DEDMS).

14. The method of claim 10, wherein the continuous deposition process includes adjusting a flow rate of an inert gas between depositing the first layer and depositing the high-k dielectric layer.

15. The method of claim 10, wherein the continuous deposition process includes adjusting an RF power between depositing the first layer and depositing the high-k dielectric layer.

16. A method of making a semiconductor device, the method comprising:
forming an adhesive layer over a substrate, the adhesion layer including tetraethoexysilane (TEOS);
forming a first layer over and in contact with the adhesive layer, wherein the first layer includes carbon (C);
forming a low-k dielectric layer over and in contact with the first layer, wherein the low-k dielectric layer comprises C, wherein an atomic percent of C in the low-k dielectric layer is less than an atomic percent of C in the first layer; and
forming a conductor in an opening in the low-k dielectric layer, first layer, and adhesive layer.

17. The method of claim 16, further comprising:
depositing an etch stop layer under the adhesion layer, wherein the etch stop layer includes one of C, Si, N or H.

18. The method of claim 17, further comprising:
forming the opening extending through the etch stop layer, the adhesion layer, and the first layer.

19. The method of claim 16, wherein the forming the first layer and the forming the high-k dielectric layer are performed by a continuous vapor deposition process using a same precursor and a same inert gas.

20. The method of claim 16, further comprising:
forming an etch stop layer over the substrate, wherein the adhesion layer is over and in contact with the etch stop layer.

* * * * *